United States Patent
Reiber et al.

(10) Patent No.: US 6,935,548 B2
(45) Date of Patent: *Aug. 30, 2005

(54) DISSIPATIVE CERAMIC BONDING TOOL TIP

(76) Inventors: Steven-Frederick Reiber, 4409 Vivien Way, Rocklin, CA (US) 95677; Mary Louise Reiber, 867 Moss Ridge, Lincoln, CA (US) 95648

(*) Notice: Subject to any disclaimer, the term of this patent is extended or adjusted under 35 U.S.C. 154(b) by 100 days.

This patent is subject to a terminal disclaimer.

(21) Appl. No.: 10/650,169

(22) Filed: Aug. 27, 2003

(65) Prior Publication Data

US 2004/0046007 A1 Mar. 11, 2004

Related U.S. Application Data

(63) Continuation of application No. 10/036,579, filed on Dec. 31, 2001, now Pat. No. 6,651,864, which is a continuation-in-part of application No. 09/514,454, filed on Feb. 25, 2000, now Pat. No. 6,354,479.
(60) Provisional application No. 60/288,203, filed on May 1, 2001, and provisional application No. 60/121,694, filed on Feb. 25, 1999.

(51) Int. Cl.[7] .......................... B23K 37/00; B23K 1/06; B23K 31/02
(52) U.S. Cl. .......................... 228/4.5; 228/1.1; 228/6.1; 228/6.2; 228/180.5
(58) Field of Search .......................... 228/1.1, 4.5, 6.1, 228/6.2, 180.5; 219/56.21, 56.22

(56) References Cited

U.S. PATENT DOCUMENTS

| | | |
|---|---|---|
| 2,892,924 A | 6/1959 | Wood |
| 3,538,205 A | 11/1970 | Gates, Jr. et al. |
| 3,660,050 A | 5/1972 | Iler et al. |
| 3,986,653 A | 10/1976 | Gilding |
| 4,020,543 A | 5/1977 | Pennings |

(Continued)

FOREIGN PATENT DOCUMENTS

| | | | |
|---|---|---|---|
| EP | 0435423 | | 7/1991 |
| GB | 2287897 | | 10/1995 |
| JP | 54037114 | | 3/1979 |
| JP | 63164228 | | 7/1988 |
| JP | 02-67741 A | * | 3/1990 |
| JP | 02-67741 | | 3/1990 |
| JP | 04-149065 A | * | 5/1992 |
| JP | 04-149065 | | 5/1992 |
| JP | 06-45389 A | * | 2/1994 |

OTHER PUBLICATIONS

Stan Weitz, "Trends in ESD Test Methods," Materials Testing Section of the ETS Testing Laboratory, Electrotech Systems, 1998, pp. 1–7.

Instrument FAQs, Drivers, Libraries and Examples, Keithley Instrument Model 6517/6517A, Keithley Instruments, Inc., 1999, pp. 1–2.

Keithley Instruments Model 6517A Electrometer/High Resistance Meter, Keithley Instruments, Inc., pp. 1–9 (date unknown).

(Continued)

*Primary Examiner*—Lynne R. Edmondson
(74) *Attorney, Agent, or Firm*—Carr & Ferrell LLP

(57) ABSTRACT

Methods for making and using dissipative ceramic bonding tool tips for wire bonding electrical connections to bonding pads on integrated circuit chips and packages. The method of using the dissipative ceramic bonding tool tip includes dissipating charge while bonding to avoid damaging delicate electronic devices by a sudden surge of accumulated charge. The method of making the tool tip includes affecting its conductivity so that it conducts electricity at a rate sufficient to prevent charge buildup, but not sufficient to overload the device being bonded. For best results, a resistance in the tip assembly itself should range from $5 \times 10^4$ or $10^5$ to $10^{12}$ ohms. In addition, the tips must also have specific mechanical properties to function satisfactorily.

3 Claims, 15 Drawing Sheets

U.S. PATENT DOCUMENTS

| | | | |
|---|---|---|---|
| 4,171,477 A | * 10/1979 | Funari | 219/56.21 |
| 4,182,947 A | 1/1980 | Brower | |
| 4,315,128 A | 2/1982 | Matcovich et al. | |
| 4,331,048 A | 5/1982 | Dworak et al. | |
| 4,387,283 A | 6/1983 | Peterson et al. | |
| 4,390,771 A | 6/1983 | Kurtz et al. | |
| 4,502,983 A | 3/1985 | Omori et al. | |
| 4,513,190 A | * 4/1985 | Ellett et al. | 219/56.21 |
| 4,555,052 A | * 11/1985 | Kurtz et al. | 228/104 |
| 4,691,854 A | 9/1987 | Haefling et al. | |
| 4,705,204 A | 11/1987 | Hirota et al. | |
| 4,772,498 A | * 9/1988 | Bertin et al. | 428/34.4 |
| 4,821,944 A | * 4/1989 | Tsumura | 228/110.1 |
| 4,897,710 A | 1/1990 | Suzuki et al. | |
| 4,909,427 A | 3/1990 | Plaisted et al. | |
| 4,998,002 A | 3/1991 | Okikawa et al. | |
| 5,123,935 A | * 6/1992 | Kanamaru et al. | 51/309 |
| 5,178,742 A | 1/1993 | Lemke et al. | |
| 5,180,093 A | 1/1993 | Stansbury et al. | |
| 5,214,259 A | 5/1993 | Terakado et al. | |
| 5,217,154 A | * 6/1993 | Elwood et al. | 228/4.5 |
| 5,280,979 A | 1/1994 | Poli et al. | |
| 5,290,507 A | 3/1994 | Runkle | |
| 5,367,956 A | 11/1994 | Fogle, Jr. | |
| 5,463,197 A | 10/1995 | Miyazaki | |
| 5,491,605 A | 2/1996 | Hughbanks et al. | |
| 5,527,441 A | 6/1996 | Offer | |
| 5,544,804 A | 8/1996 | Test et al. | |
| 5,601,740 A | 2/1997 | Eldridge et al. | |
| 5,616,257 A | 4/1997 | Harada et al. | |
| 5,649,355 A | 7/1997 | Offer | |
| 5,651,901 A | 7/1997 | Mohri et al. | |
| 5,676,856 A | 10/1997 | Haji et al. | |
| 5,797,388 A | 8/1998 | Nakamura et al. | |
| 5,816,472 A | * 10/1998 | Linn | 228/1.1 |
| 5,827,470 A | 10/1998 | Chatterjee et al. | |
| 5,931,368 A | 8/1999 | Hadar et al. | |
| 6,030,472 A | 2/2000 | Hajaligol et al. | |
| 6,073,827 A | 6/2000 | Razon et al. | |
| 6,354,479 B1 | * 3/2002 | Reiber et al. | 228/4.5 |
| 6,651,864 B2 | * 11/2003 | Reiber et al. | 228/4.5 |

OTHER PUBLICATIONS

"Low–Current/High–Resistance Meters," Keithley Instruments Model 6517A, Keithley Instruments, Inc. pp. 112–115 (date unknown).

Keytech 200 XV–2 ESD Simulator, Kandus Equipment, p. 1 (date unknown).

Newburg, Carl E., "Test Report", Anza Technolgy, Incorporated Static Dissipative Ceramic Rods . . . , Report 190:2000–92, River's Edge Technical Service, Nov. 29, 2000, pp. 1–5.

Huntsman, James et al., "Test Methods for Static Control Products," Electrical Overstress/Electrostatic Discharge Sym., Sep. 21, 1982, pp. 94–109, vl. 4, IIT Rsrch Inst.

* cited by examiner

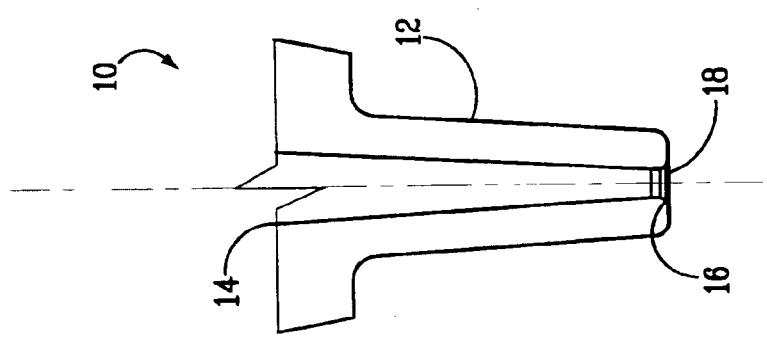
FIG. 3 BOTTLE-NECK CAPILLARY PRIOR ART
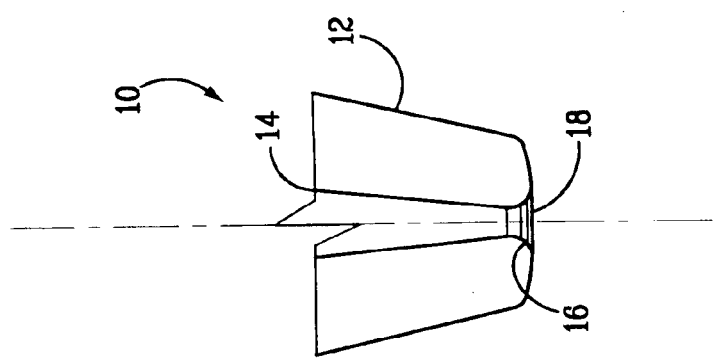
FIG. 2 NORMAL CAPILLARY PRIOR ART
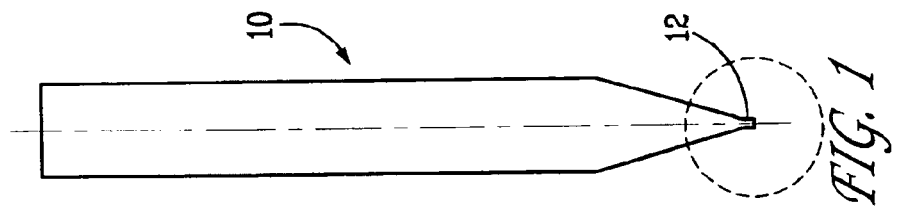
FIG. 1 PRIOR ART

TIP DETAIL
PRIOR ART

Transducer Horn Tip and Wedge Detail

TIP DETAIL

BOTTLE-NECK CAPILLARY

NORMAL CAPILLARY

| Reading @ | Rod #1 | | Rod #2 | |
|---|---|---|---|---|
| | 10V | 100V | 10V | 100V |
| 1" | $2.11 \times 10^8 \Omega$ | $1.80 \times 10^8 \Omega$ | $2.38 \times 10^8 \Omega$ | $1.89 \times 10^9 \Omega$ |
| 2" | $2.78 \times 10^8 \Omega$ | $2.42 \times 10^8 \Omega$ | $4.13 \times 10^8 \Omega$ | $3.63 \times 10^8 \Omega$ |
| 3" | $3.34 \times 10^8 \Omega$ | $3.03 \times 10^8 \Omega$ | $5.49 \times 10^8 \Omega$ | $5.17 \times 10^8 \Omega$ |
| 4" | $4.35 \times 10^8 \Omega$ | $4.09 \times 10^8 \Omega$ | $8.52 \times 10^8 \Omega$ | $8.25 \times 10^8 \Omega$ |
| 5" | $5.67 \times 10^8 \Omega$ | $5.46 \times 10^8 \Omega$ | $1.27 \times 10^9 \Omega$ | $1.22 \times 10^9 \Omega$ |
| 6" | $7.05 \times 10^8 \Omega$ | $6.93 \times 10^8 \Omega$ | $1.26 \times 10^9 \Omega$ | $1.23 \times 10^9 \Omega$ |
| Average | $4.22 \times 10^8 \Omega$ | $3.96 \times 10^8 \Omega$ | $7.64 \times 10^8 \Omega$ | $1.01 \times 10^9 \Omega$ |
| Minimum | $2.11 \times 10^8 \Omega$ | $1.80 \times 10^8 \Omega$ | $2.38 \times 10^8 \Omega$ | $3.63 \times 10^8 \Omega$ |
| Maximum | $7.05 \times 10^8 \Omega$ | $6.93 \times 10^8 \Omega$ | $1.27 \times 10^9 \Omega$ | $1.89 \times 10^9 \Omega$ |

FIG. 17

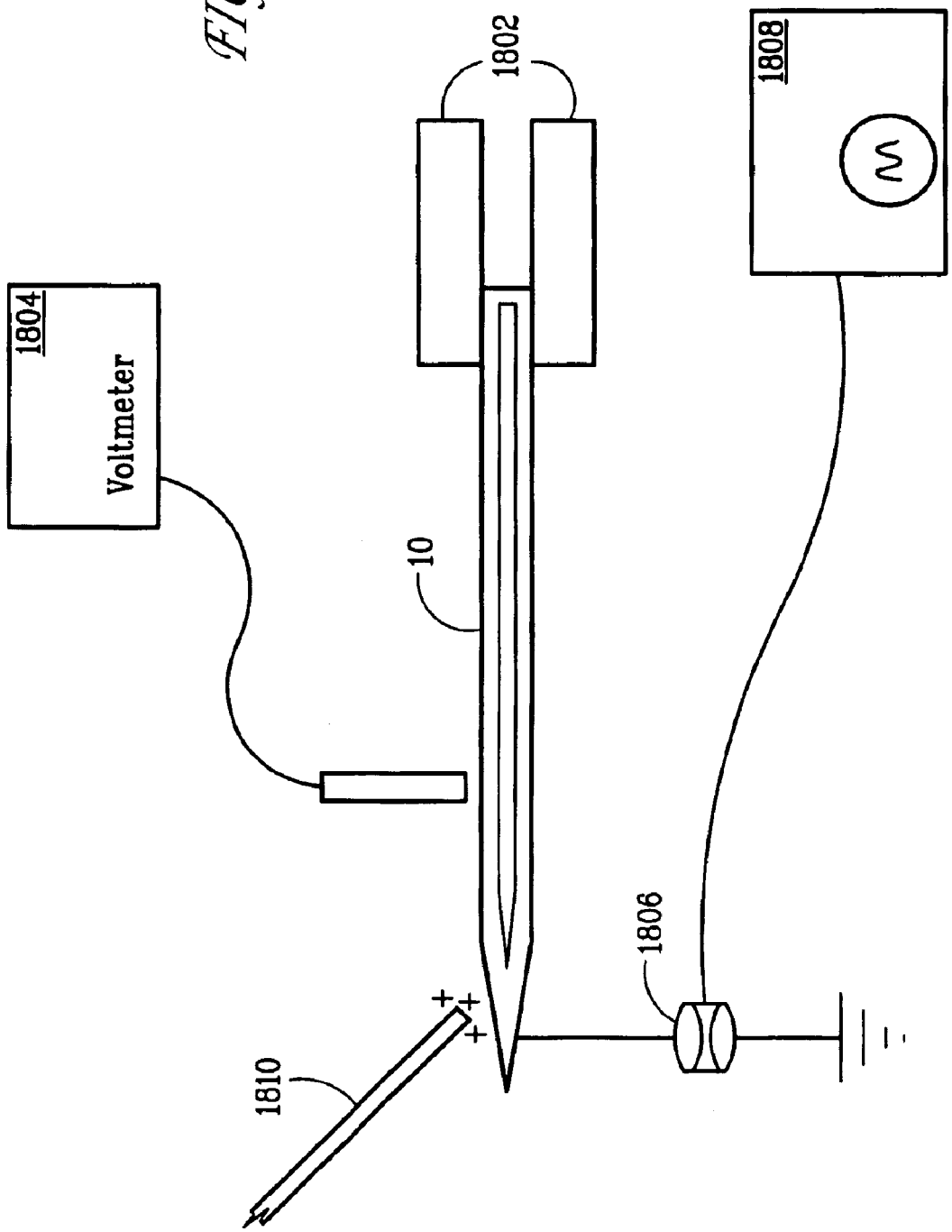

| Reading # | Small Diameter Rod #1 | Small Diameter Rod #2 |
|---|---|---|
| 1 | 0.16 sec. | 0.48 sec. |
| 2 | 0.16 sec. | 0.21 sec. |
| 3 | 0.20 sec. | 0.12 sec. |
| 4 | 0.21 sec. | 0.22 sec. |
| 5 | 0.21 sec. | 0.23 sec. |
| 6 | 0.15 sec. | 0.22 sec. |
| Average | 0.18 sec. | 0.25 sec. |
| Minimum | 0.15 sec. | 0.12 sec. |
| Maximum | 0.21 sec. | 0.48 sec. |

FIG. 19

DISSIPATIVE CERAMIC BONDING TOOL TIP

CROSS REFERENCE TO RELATED APPLICATIONS

This application is a continuation of U.S. patent application Ser. No. 10/036,579 filed Dec. 31, 2001 now U.S. Pat. No. 6,651,864 issued Nov. 25, 2003 entitled "Dissipative Ceramic Bonding Tool Tip" which claims the priority benefit of U.S. provisional patent application Ser. No. 60/288,203 filed May 1, 2001 entitled "Dissipative Ceramic Bonding Tip" and is also a continuation-in-part of U.S. patent application Ser. No. 09/514,454 filed Feb. 25, 2000 now U.S. Pat. No. 6,354,479 issued Mar. 12, 2002 entitled, "Dissipative Ceramic Bonding Tool Tip," which claims the priority benefit of U.S. provisional patent application Ser. No. 60/121,694 filed Feb. 25, 1999 entitled "Dissipative Ceramic Bonding Tool Tip." The contents of the above applications are incorporated herein by reference.

BACKGROUND OF THE INVENTION

1. Field of the Invention

This invention relates to bonding tool tips in general and more particularly to ceramic tool tips for bonding electrical connections.

2. Description of the Prior Art

Integrated circuits are typically attached to a lead frame, and individual leads are connected with wire to individual bond pads on the integrated circuit. The wire is fed through a tubular bonding tool tip having a bonding pad at the output end. These tips are called capillary tips. An electrical discharge at the bonding tool tip supplied by a separate Electronic Flame Off (EFO) device melts a bit of the wire, forming a bonding ball. Other bonding tools do not have the center tube, but have a feed hole or other feature for feeding the wire along, as needed. Some bonding tool tips have no such arrangement for feeding wire, such as bonding tool tips for magnetic disk recording devices, where the wire is insulated and bonded to a magnetic head and then to a flexible wire circuit.

When the bonding tool tip is on the integrated circuit die side of the wire connection, the wire will have a ball formed on the end of the wire, as above, before reaching the next die bonding pad. The ball then contacts the film formed on the die pad on the integrated circuit. The bonding tool tip is then moved from the integrated circuit die pad, feeding out gold wire as the tool is moved, onto the bond pad on the lead frame, and then scrubbed laterally by an ultrasonic transducer. Pressure from the bonding tool tip and the transducer, and capillary action, causes the wire to "flow" onto the bonding pad where molecular bonds produce a reliable electrical and mechanical connection.

Bonding tool tips must be sufficiently hard to prevent deformation under pressure, and mechanically durable so that many bonds can be made before replacement. Prior art bonding tool tips were made of aluminum oxide, which is an insulator that is durable enough to form thousands of bonding connections. Bonding tool tips must also be designed to produce a reliable electrical contact, yet prevent electrostatic discharge damage to the part being bonded. Certain prior art devices emit one or more volts when the tip makes bonding contact. This could present a problem, as a one volt static discharge could cause a 20 milliamp current to flow, which, in certain instances, could damage the integrated circuit or magnetic recording head.

U.S. Pat. No. 5,816,472 to Linn describes a durable alumina bonding tool "without electrically conductive metallic binders" that is therefore an insulator. U.S. Pat. No. 5,616,257 to Harada describes covering a bonding tool electrode with an insulating cap or covering "made of a ceramic material" to produce a large electrostatic discharge that creates bonding balls of stable diameter. U.S. Pat. No. 5,280,979 to Poli describes a vacuum wafer-handling tool having a ceramic coating "made with a controlled conductivity" to prevent a large electrostatic discharge.

SUMMARY OF THE INVENTION

The present invention may provide electrically dissipative ceramic bonding tool tips for bonding electrical connections to bonding pads on electrical devices. In accordance with principles of the present invention, the method of using the invention involves an added step of dissipating electrical charge at a rate sufficiently high to prevent charge buildup, but not high enough to overload the device being bonded. This added step is at least partially counter-intuitive because ordinarily charge dissipation is avoided so as not to overload the circuit. Consequently, to avoid damaging delicate electronic devices by any electrostatic discharge, the bonding tool tip is made to conduct electricity at a rate sufficiently high to prevent charge buildup, but not high enough to overload the device being bonded. In other words, it is desirable for the bonding tool tip to discharge slowly. The tip needs to discharge to avoid a sudden surge of current that could damage the part being bonded. For best results, a resistance in the tip assembly itself should range from about $5 \times 10^4$ or $10^5$ to $10^{12}$ ohms. This range of resistances is adequate no matter the method of characterizing the resistance. The tools may also have a high stiffness and high abrasion resistance so that the tools have a long lifetime. However, bonding tool tips having a low stiffness and low abrasion resistance may also be made, except that they would have a short lifetime. Possible materials that can be used for the bonding tool tips that have a high abrasion resistance and high stiffness include ceramics (electrical non-conductors) or metals, such as tungsten carbide (an electrical conductor).

In the present invention, bonding tool tips with the desired electrical conduction can be made in at least three different configurations.

First, the tools can be made from a uniform extrinsic semiconducting material that has dopant atoms in the appropriate concentration and valence states to produce sufficient mobile charge carrier densities (unbound electrons or holes) that will result in electrical conduction in the desired range. For example, the tools can be made from polycrystalline silicon carbide uniformly doped with boron.

Second, the tools can be made with a thin layer of a highly doped semiconductor on an insulating core. In this case, the core provides the mechanical stiffness and the semiconductor surface layer provides abrasion resistance and provides a charge carrier path from the tip to the mount that will permit dissipation of electrostatic charge at an acceptable rate. For example, the tools can be made from a diamond tip wedge that has a surface that is ion implanted with boron.

Third, the tools can be made with a lightly doped semiconductor layer on a conducting core. The conducting core provides the mechanical stiffness and the semiconductor layer provides abrasion resistance and provides a charge carrier path from the tip to the conducting core, which is electrically connected to the mount. The doping level is chosen to produce a conductance through the layer that will permit dissipation of electrostatic charge at an acceptable rate. For example, the tools can be made from a cobalt-bonded tungsten carbide coated with titanium nitride carbide.

BRIEF DESCRIPTION OF THE DRAWINGS

FIG. 1 is a vastly enlarged cross-sectional view of a capillary bonding tool tip;

FIG. 2 is a vastly enlarged cross-sectional view of a capillary-type construction of the operating end or tip of a bonding tool;

FIG. 3 is a cross-sectional view of a bottle-neck capillary bonding tool tip;

FIG. 17 is a table of resistances for two ceramic bonding tools measured at the points shown in FIG. 16;

FIG. 18 is a schematic representation of the experimental setup used for measuring the static discharge;

FIG. 19 is a table showing the static decay times measured using the experimental setup of FIG. 18.

DETAILED DESCRIPTION OF THE INVENTION

Figure 5A:
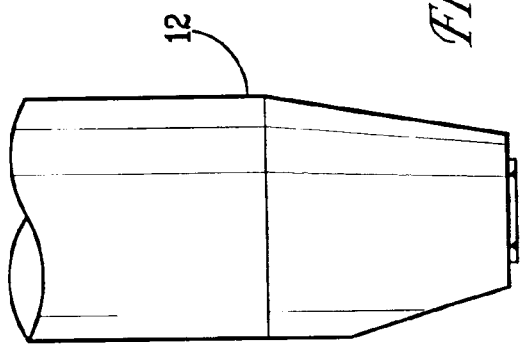
FIGS. 5a and 5b are side and end views, respectively, of the wedge design bonding tool tip shown in FIG. 4.

FIG. 1 illustrates a typical capillary bonding tool 10 according to the invention. Such bonding tools 10 can be about one-half inch (12–13 mm) long and about one-sixteenth inch (1.6 mm) in diameter. The bonding tool tip 12 can be from 1 to 8 mils, 2 to 6 mils, or 3 to 10 mils (0.08 to 0.25 mm) long. Running the length of the tool itself, but not viewable in FIG. 1, is a tool hole that accommodates a continuously fed length of gold wire (not shown).

FIG. 2 is a highly enlarged, cross-sectional view of the capillary bonding tool 10 shown in FIG. 1. Only the portion of the bonding tool 10 that is shown within the dotted circle in FIG. 1 is shown in FIG. 2. Tool tip 12 has a tool hole 14 which may run the entire length of bonding tool 10. The wire (not shown) exits the tool tip 12 through an exit hole 18. If a ball is formed on the wire, the ball is seen immediately adjacent the exit hole 18. The wire may be gold, for example, but could be made from other conductive metals or mixtures of conductive metals. The chamfer 16 at the exit hole 18 has at least two purposes. First, the chamfer 16 accommodates a ball that has been formed at the end of the wire. Second, the chamfer surface 16 allows a smoother looping of the wire as the bonding tool 10 is moved from the bonding pad on an integrated circuit (not shown) to a bonding pad (not shown) on a lead frame (not shown) of an integrated circuit assembly (not shown). The inner diameter of the bonding tool tip 10 may be about 1.5 times the width of the wire being fed through it. For example the inner diameter may be 1.3 or 1.4 to 1.6 microns.

Although the size of the bonding tool 10 may change according to the size of the component being manufactured, the diameter of the tool tip 12 may remain essentially the same.

FIG. 3 shows an alternative embodiment of a bonding tool 10 having similar features, such as the tool hole 14, chamfer surface 16, and exit hole 18. This bonding tool tip, named a bottle-neck capillary tip, is provided for narrower bond situations where the bonding pitch (distance between the centers of the bonding pads) is small. Bonding tool tips and the bonding pitch tend to get smaller as the dimensions of integrated circuits get smaller, or as the number of circuits on a chip gets larger, while the die area remains more or less constant.

Figure 5B:
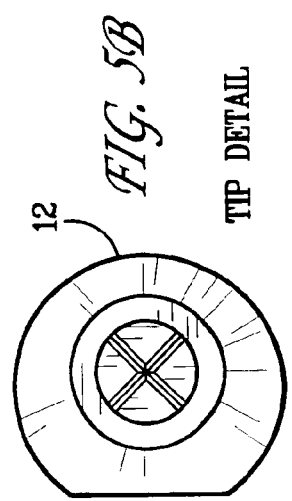
Figure 4:
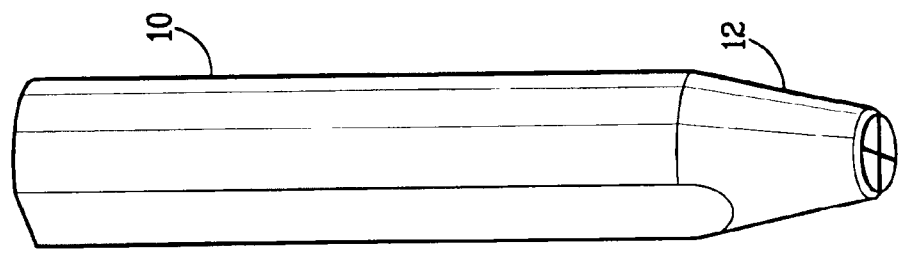
FIG. 4 is an isometric view of a wedge bonding tool tip.

FIG. 4 shows still another type of bonding tool 10, called a wedge tool, having end 14, raised portion 16, and grooves 18. The FIG. 4 embodiment of bonding tool 10 can be used for disk drive bonding where it is used to capture the insulated wire, lay it on the head of bonding tip 12 and ultrasonically bond it to a part of the disk drive system, for example, or other device being bonded. Bonding tool 10 may also be used with an integrated circuit die mounted on a lead frame (not shown). When bonding a magnetic recording head or integrated circuit dies the wires from the magnetic recording head or integrated circuit die may not be connected from the die directly to connections in an integrated circuit package, but from the magnetic recording head or integrated circuit die to a lead frame, as is well-known to skilled practitioners in the art. The composition of the lead frame may be different than the composition of the integrated circuit package. The tip 12 of the bonding tool 10 of FIGS. 5a and 5b accommodates the different physical attributes of different integrated circuit lead frames. The grooves 18 in FIGS. 4, 5a and 5b frictionally hold the pad being bonded in place during ultrasonic bonding. The grooves 18 are typically "v" shaped but other shapes such as cylindrical also work. The size of the grooves 18 and/or die area may be kept essentially constant despite differences in size of the component being worked on. The width of the grooves 18 may be approximately the same or slightly smaller than the diameter of the wire being bonded. In an embodiment, the grooves 18 are 1 to 30 microns wide and 1 to 30 microns deep. The grooves 18 may cut through the entire depth of the raised portion 16, which may also be 1 to 30 microns deep. In an embodiment, raised portion 16 is 6 to 7 microns deep, grooves 18 are 2.5 to 4.5 microns deep, raised portion 16 is 100 to 150 microns wide. Raised portion 16 and end 14 may be 8 to 35 or 40 microns wide. Although FIGS. 4, 5a, and 5b show two grooves 18 forming a cross the bonding tool tip 12 may have just one groove or a mesh of intersecting and/or parallel groves. Although the grooves 18 are illustrated as being perpendicular they may be at any angle with respect to one another.

Figure 6A:
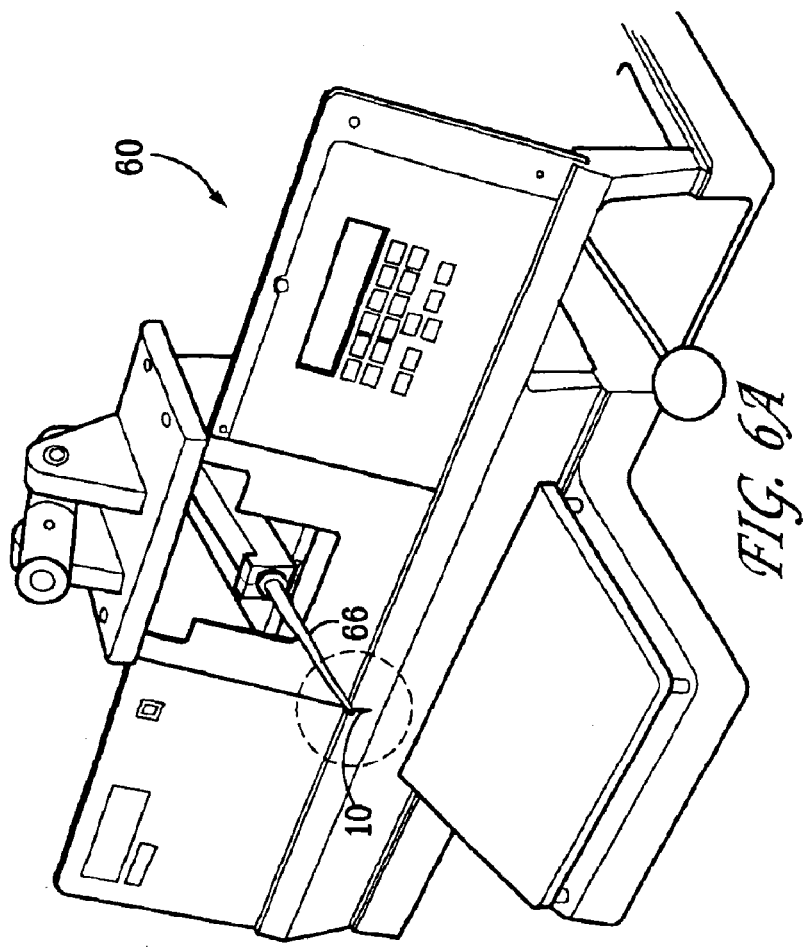
FIGS. 6a and 6b are an isometric view and a detailed close-up, respectively, of an apparatus utilized in the wire bonding of a semiconductor integrated circuit chip or other apparatus.
Figure 6B:
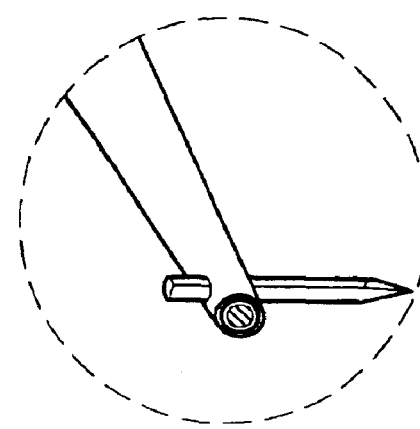

FIG. 6a illustrates a typical wire bonding machine 60 for use in bonding wire leads in magnetic disk drive units. Shown within the dotted circle is the bonding tool 10. The bonding tool 10 is mounted to an arm 66 that can be moved in the desired directions by the apparatus of wire bonding machine 60. Such a machine is available as Model 7400 from the West Bond Company in Anaheim, Calif.

Typical bonding tool tips available on the market today are made of an insulator of alumina ($Al_2O_3$), sometimes termed aluminum oxide, ruby, or sapphire, which are very hard compounds that have been used successfully on commercial machines. Wire bonding tool tips made of alumina, ruby, or sapphire have a reasonably long lifetime. In the prior art, to ensure that the tool tip is an insulator, no conductive binders are used in these bonding tool tips. However, as stated previously, a problem has existed that an electrostatic discharge from the bonding tool making contact with the bonding pad of the circuit can damage the very circuit it is wiring.

In accordance with principles of the present invention, to avoid damaging delicate electronic devices by this electrostatic discharge, bonding tool tip 12 should conduct electricity at a rate sufficiently high to prevent charge buildup, but not high enough to overload the device being bonded. It has been determined that the bonding tool 10 may have an electrical conductance greater than one ten-billionth of a mho (i.e. $>1\times10^{-12}$ reciprocal ohms ($\Omega^{-1}$) of power) and its electrical conductivity may be less than one one-hundred thousandth of a mho (i.e. $<1\times10^{-5}$ $\Omega^{-1}$). The resistance should be low enough that the material is not an insulator that does not allow charge dissipation, and high enough that it is not a conductor allowing a current flow that is damaging to the device being bonded. For best results, a resistance in the tip assembly itself should range from $5\times10^4$ or $10^5$ to $10^{12}$ ohms. For example, today's magnetic recording heads are damaged by 5 milliamps of current. In an embodiment that may be used with magnetic recording heads, no more than 2 to 3 milliamps of current should be allowed to pass through the bonding tool tip 12 to the head.

In an embodiment, to achieve high stiffness and high abrasion resistance, ceramics (electrical non-conductors) or metals, such as tungsten carbide (an electrical conductor) are used. The bonding tool tip of this embodiment may have a Rockwell hardness of about 25 or above, preferably of about 32 or above. The tip needs to be able to last for at least two bondings.

In the present invention, bonding tool tips with the desired electrical conduction can be made in at least three different configurations.

First, the tools can be made from a uniform extrinsic semiconducting material that has dopant atoms in the appropriate concentration and valence states to produce sufficient mobile charge carrier densities (unbound electrons or holes) that will result in electrical conduction in the desired range. For example, polycrystalline silicon carbide uniformly doped with boron can give the desired range of conductivity. Preferably the amount of boron used is 5–7% by weight of the polycrystalline silicon carbide.

Second, the tools can be made by forming a thin layer of a highly doped semiconductor on an insulating core. For example, a diamond tip wedge may have a surface that is ion implanted with boron or have a surface that is a doped ceramic. In this case the core provides the mechanical stiffness and the semiconductor surface layer provides abrasion resistance and provides a charge carrier path from the tool tip 12 to the mount (not shown), which will permit dissipation of electrostatic charge at an acceptable rate. The conductance of the semiconductor surface layer should be about $10^8$–$10^9$ $\Omega^{-1}$.

Third, the tools can be made by forming a lightly doped semiconductor layer on a conducting core, for example, a cobalt bonded tungsten carbide core coated with titanium nitride carbide. The conducting core provides the mechanical stiffness and the semiconductor layer provides abrasion resistance and provides a charge carrier path from the device being bonded to the conducting core, which is electrically connected to the mount. The doping level is chosen to produce a conductance through the layer that will permit dissipation of electrostatic charge at an acceptable rate. The conductivity of the semiconductor surface layer should be about $10^7$–$10^8$ $\Omega^{-1}$.

Figure 9:
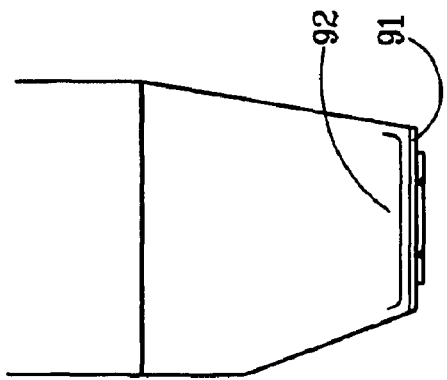
FIG. 9 is a cross-section of an embodiment of FIG. 5 having two layers.
Figure 8:
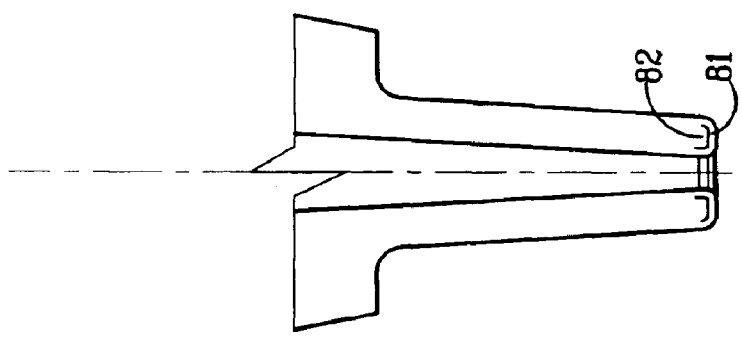
FIG. 8 is a cross-section of an embodiment of FIG. 3 having two layers.
Figure 7:
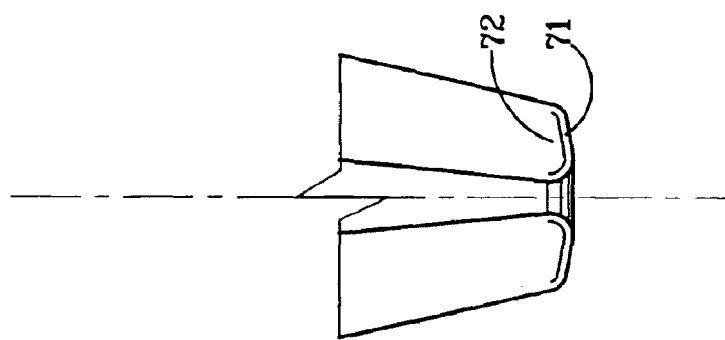
FIG. 7 is a cross-section of an embodiment of FIG. 2 having two layers.

FIGS. 7, 8 and 9 illustrate the two-layered structure of the last two configurations. This structure is not intended to be specific to the type of tool tip. Rather, it could be used for any bonding tool tip. Layers 71, 81, and 91 could be 100–1000 Angstroms thick, for example. In the second and third configurations, the outer layers are labeled 71, 81, and 91 and the cores are labeled 72, 82, and 92. In the second configuration, mentioned above, layers 71, 81, and 91 are highly doped semiconductor and the cores 72, 82, and 92 are insulators. In the third configuration, mentioned above, layers 71, 81, and 91 are lightly doped semiconductor and the cores 72, 82, and 92 are conductors. No significance should be attached to the relative thickness or scale of the portions of the layer 71, 81, and 91, which may or may not have a uniform thickness.

Dissipative tools can be manufactured by any of several methods.

Figure 10:
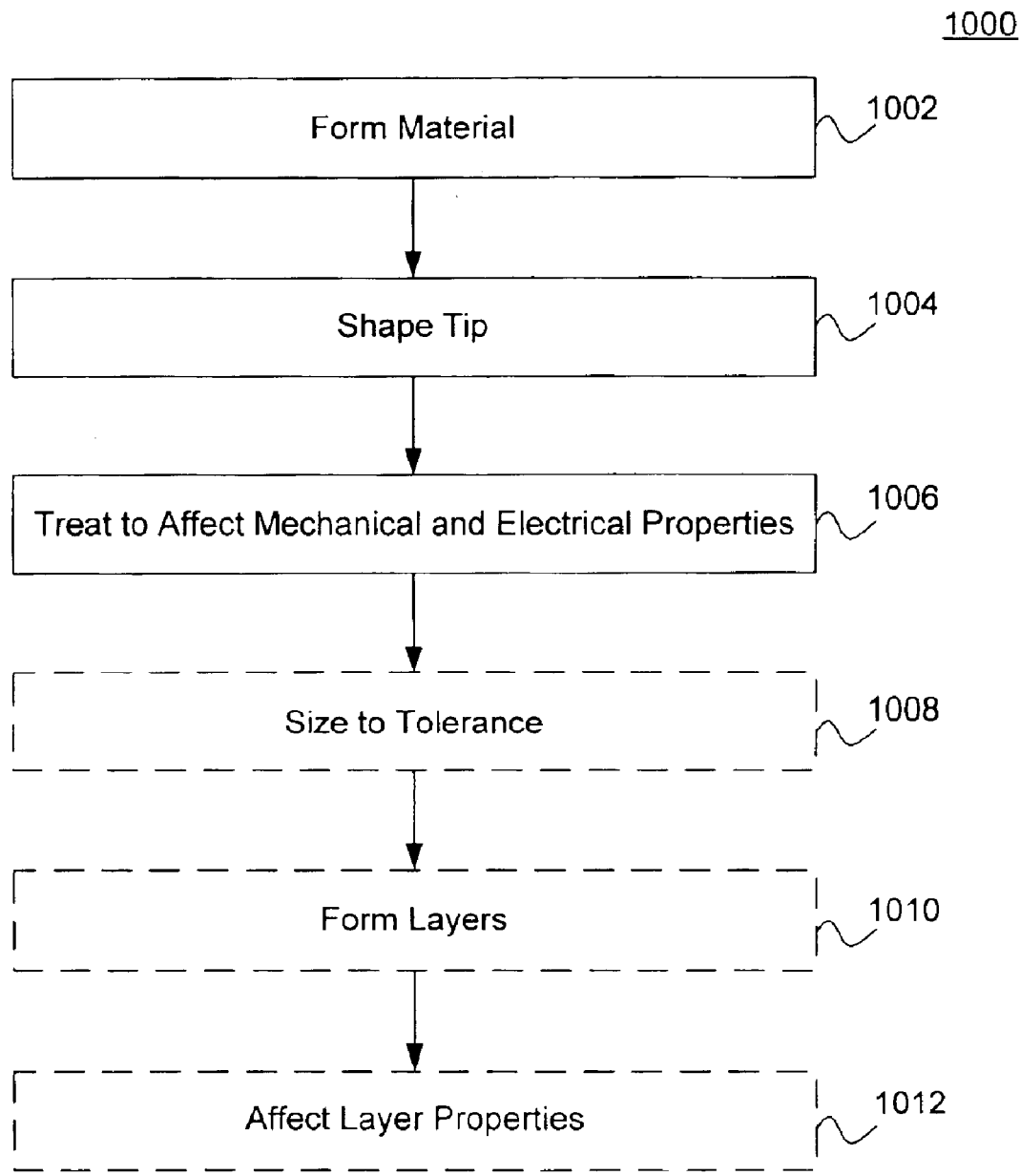
FIG. 10 is a flowchart of a generic method for making a dissipative tool.

FIG. 10 illustrates a generic method 1000 for manufacturing dissipative tools. The process of creating a ceramic part may start with a powder having the same or a similar composition as desired in the ceramic part to be created. The quality of the ceramic component may be influenced by the quality of the ceramic powder used. To ensure quality, the ceramic powder may be tested and processed multiple times. The purity, concentration of agglomerations, and particle size of the ceramic powder may be monitored. The powder may be milled (e.g., attrition milled, balled milled, or turbo milled). The milling operation refines the particle size of the ceramic powder before process 1000 begins. In step 1002 a material, which may initially be a powder, is formed having the desired composition. The material is next shaped and sized in step 1004 into a form appropriate for the tool. The material may be further treated in step 1006 to affect or impart desired mechanical, chemical and/or electrical properties. Depending upon the embodiment, steps 1002, 1004, and 1006 may be performed simultaneously as part of one process. Since the properties of the material depend upon the process of making and the materials used for making the composition, parts or all of step 1006 may be performed before step 1004. In optional step 1008 the material is sized to tolerance. In optional step 1010 the layering is formed. In optional step 1012 the material is further treated to impart desired properties to the layers or affect the desired properties of the layers.

Figure 11:
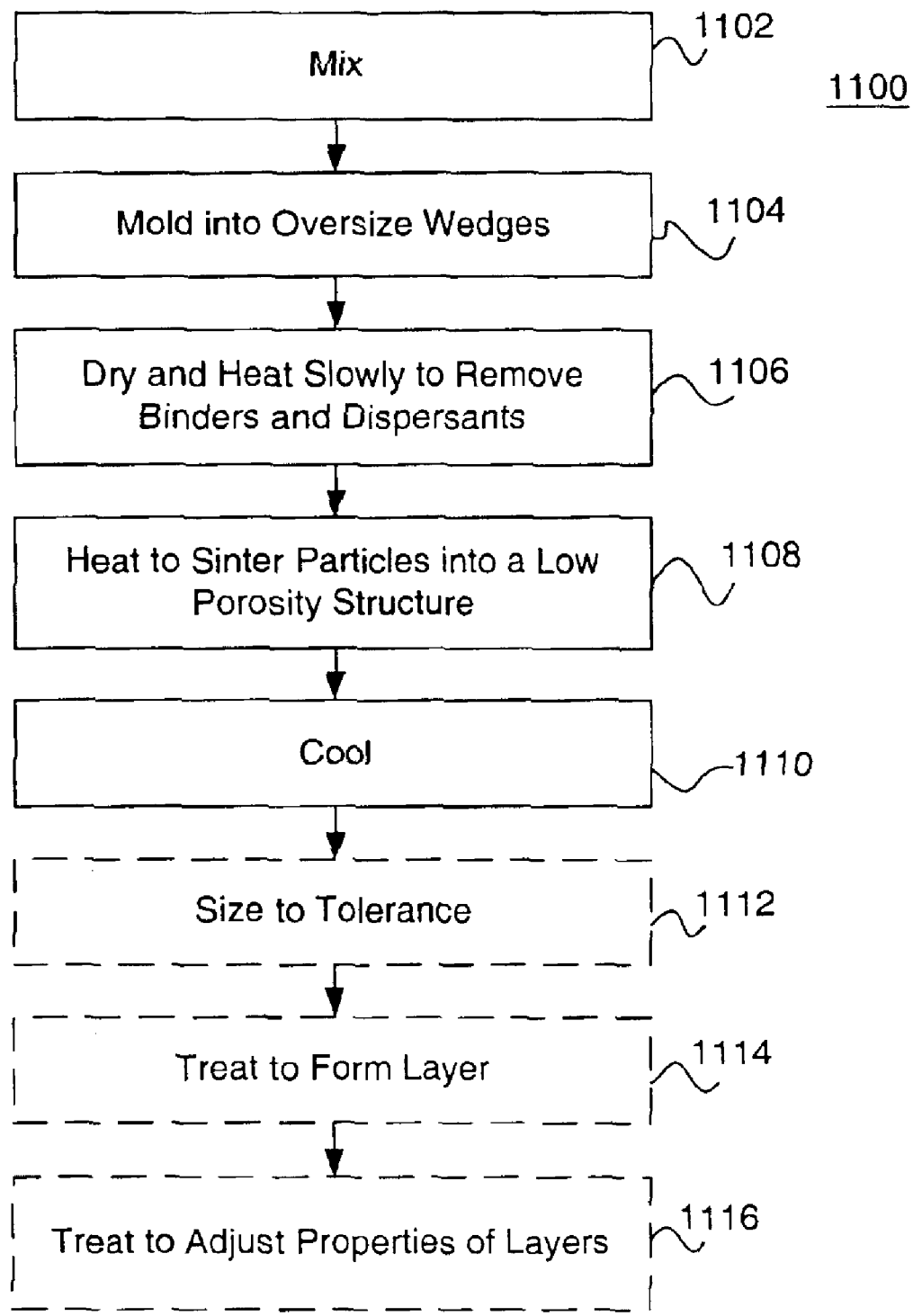
FIG. 11 is a flowchart of a first exemplary embodiment of the method of FIG. 10.
Figure 12:
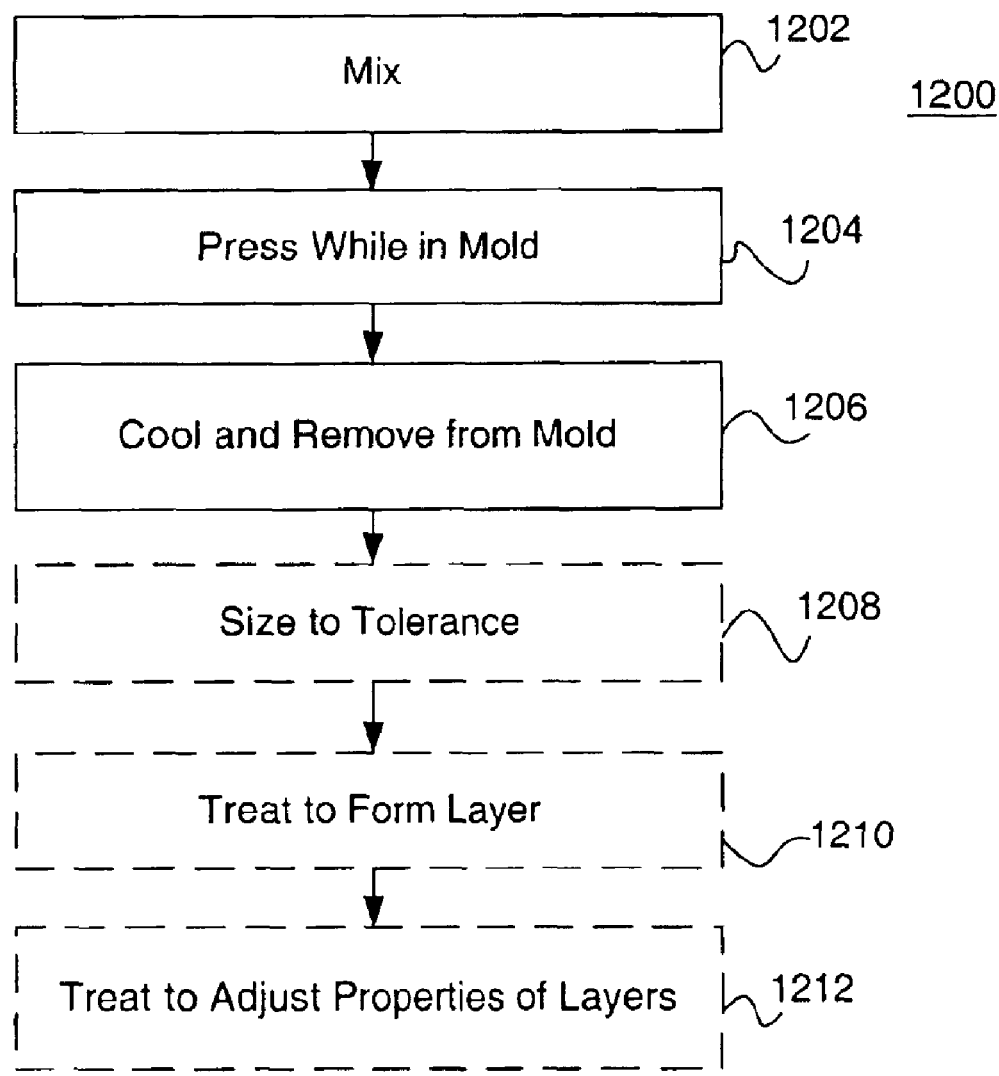
FIG. 12 is a flowchart of a second exemplary embodiment of the method of FIG. 10.
Figure 13:
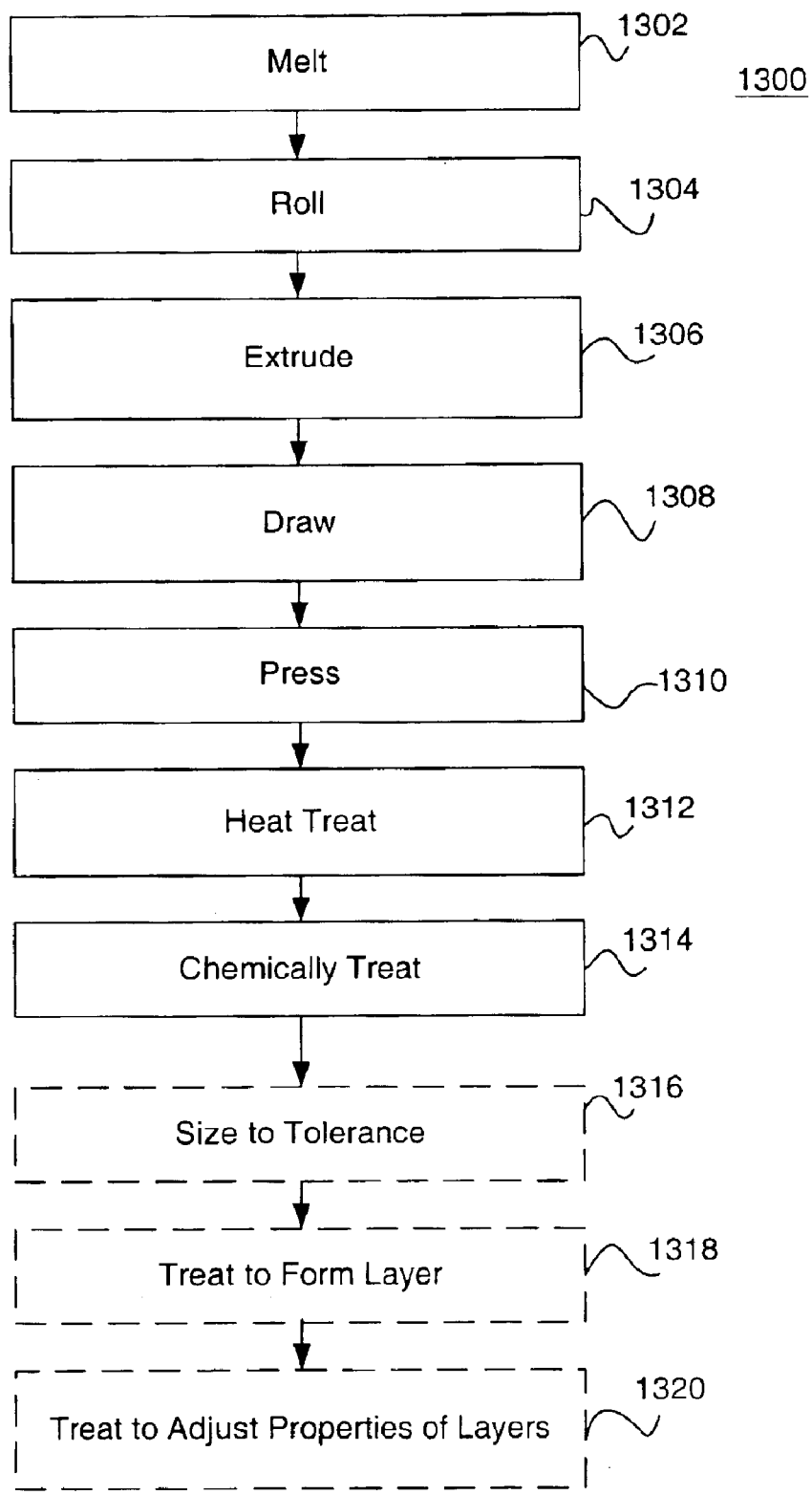
FIG. 13 is a flowchart of a third exemplary embodiment of the method of FIG. 10.

FIGS. 11–13 show three examples of the method of FIG. 10.

FIG. 11 shows method 1100, which includes mixing, molding and sintering reactive powders of, for example, alumina ($Al_2O_3$), zirconia ($Zr_2O_3$), iron oxide ($FeO_2$), or titanium oxide ($Ti_2O_3$).

In general, sintering may involve the densification of powder compacts at a temperature below the melting point of the powder. The shrinkage occurs as the pores between the particles decrease in size until they are eliminated. The driving force of the sintering process is the reduction of surface energy. During the sintering of two spherical particles, for example, the inter-particle contact areas will increase as the growth into a neck between the particles increases. There are three basic stages involved with the sintering process. In the first stage, the material between the particles moves outward by viscous flow, plastic flow or volume diffusion and is deposited on the neck area. The distance between the particle centers decreases and shrinkage occurs. If the material is transported from the circumference into the neck by evaporation-condensation or surface diffusion then there is no shrinkage. In the second stage, the growing necks merge, the original particle structures disappear and are replaced by polycrystalline bodies with an inter-granular pore network along grain boundary edges. The grain growth can occur by the movement of grain boundaries towards their centers of curvature. In the third stage the grain growth continues; pores become closed at grain corners and further densification occurs as the pores shrink. If the grain boundaries are sufficiently curved, they can move over the pores leaving them isolated in the grains. The process of further shrinkage may be slow once the pores are within the grains.

In step 1102 fine particles (e.g., a half of a micron in size) of the desired composition are mixed with organic and inorganic solvents, dispersants, binders, and sintering aids. The solvents could be Yttrium or $H_2O$, for example. The binder and/or the sintering aids could be any of, any combination of, or all of ceria, magnesia, yttria, boron, carbon colloidal silica, alumina solvents, ethyl silicate, any phosphate, any rare earth metal oxide, or yttrium, for example. In step 1104 the mix is molded into oversize wedges. The pieces are carefully dried, and heated slowly in step 1106 to remove the binders and dispersants and then heated in step 1108 to a high enough temperature so that the individual particles sinter together into a solid structure with low porosity. The slow heating can be done over three to eight hours at a rate of 50° C. to 200° C. every 15 minutes, for example, in an atmosphere of 500° C. or 1000° C. to 2500° C. for 3 to 24 hours, so as to obtain low porosity, and to obtain homogeneity. The sintering can occur at 4000° C., for example. The heat-treating atmosphere is chosen to facilitate the removal of the binder at a low temperature and to control the valence of the dopant atoms at the higher temperature and while cooling. The low porosity can be ensured by keeping the grain size less than about half a micron. Next, in step 1110, the solid structures are allowed to cool preferably over a period of one to two hours. After cooling, in optional step 1112, the pieces may be machined or otherwise sized to achieve the required tolerances. In optional step 1114 the pieces may then be treated to produce the desired surface layer by ion implementation, vapor deposition, chemical vapor deposition, physical deposition, electroplating deposition, neutron bombardment, or combinations of the above. The pieces may be subsequently heat treated in optional step 1116 in a controlled atmosphere to produce desired layer properties (e.g., the desired hardness and resistivity) through diffusion, recrystallization, dopant activation, or valence changes of metallic ions.

In an example, in step 1104 silicon nitride or zirconia ceramic materials could be fabricated by firing a powder compact at a suitable temperature until agglomeration of the particles occurs with a decrease in the surface area and porosity of the compact. This process may involve chemical reactions, crystal growth and/or the formation of liquid phases and solid state diffusion. An untreated silicon nitride ceramic powder is typically in the alpha phase. The sintering process of step 1106 involves heating the ceramic powder to +2000° C. to convert the powder to the preferred beta-$Si_3N_4$ state. The beta-$Si_3N_4$ state has the high thermo-mechanical properties suitable for high temperature applications such as resistive heating. Silicon nitride is very difficult to sinter because it has very strong directional covalent bonds. Although silicon nitride may be at least partially sintered without adding sintering aids, the ceramic powder may not completely turn from the alpha phase to the beta-$Si_3N_4$ phase during the heating process without the sintering aids. Sintering aids of rare earth oxides and other oxides may act as nucleating agents for the $Si_3N_4$ powders to nucleate the formation of grains. Yttria ($Y_2O_3$) and Aluminum Oxide ($Al_2O_3$) may be used as the sintering aids although other sintering aids will also work.

In another example, silicon carbide, zirconia, or silicon nitride could be used for the bonding tip 12. Although silicon nitride does not need much preparation before it enters the sintering stage of step 1106, silicon carbide and zirconia have two phases that can exist that may affect the quality of the finished product. Silicon nitride has two phases, alpha and beta-$Si_3N_4$, a hexagonal structure, and can be used to make a polycrystalline ceramic. Similarly, zirconia exists as a monoclinic crystal at room temperature and inverts to a tetragonal phase above 1200° C. In other words, zirconia has a low temperature monoclinic state and a high temperature tetragonal state. The silicon nitride beta phase and the tetragonal zirconia crystal have the higher strength properties of their two respective phases but some stabilizers should be added in step 1102 in order to induce silicon nitride and zirconia to remain in their beta phase and tetragonal phase, respectively, during the cooling step 1110. For example, a stabilizer such as magnesium oxide may be added in step 1102 to prevent the transformation upon cooling in step 1110. The addition of yttria in step 1102 yields an extremely fine grained (less than 1 micron) microstructure known as tetragonal zirconia polycrystal (TZP).

The process of mixing in the additives during step 1102 to achieve the higher strength phase is called forming the green body.

There are several other types of sintering processes that can be used to manufacture the bonding tool tip. In reaction bonding sintering, in step 1106 the green body is placed in a chamber where it is heated and infiltrated with a reacting gas to form a compound. The process of reaction bonding silicon nitride to form a silicon nitride bonding tool tip involves taking a silicon green body between steps 1106 and 1108 and reacting the body to a gas of hydrogen and nitrogen to form $Si_3N_4$. Exposing the green body to the hydrogen and nitrogen gas is commonly known as nitriding. The body is nitrided in the gas starting at 1150° C. and slowly increasing the temperature to 1420° C. The resulting product is a mixture of alpha and beta silicon nitrides with 18 to 25% porosity. The original dimensions of the silicon compact remain virtually unchanged during the nitriding. The bonding tool tip can be machined after partial nitriding in step 1112. Reaction bonding can be relatively cheap.

When using hot press sintering to form a bonding tool tip, a ceramic powder is placed in a die and then it is compressed at a high pressure while the powder is heated in step 1104. When working with silicon nitride powers, the powder is hot pressed with a suitable oxide additive in a graphite die and it may be heated by induction, for example, to 1700° C. to 1800° C. to give a fully dense high strength beta-silicon nitride. Diamond machining follows the hot pressing.

When using Hot Isostatic Pressing (HIP) to form the bonding tool tip, in step 1104 the powder is placed in an evacuated pressure vessel. The vessel will simultaneously heat and isostatically press the material with an inert gas with pressures as high as 310 MPa (45,000 psi) and temperatures up to 2000° C. The powder is simultaneously heated and isostatically pressed by inert gas pressure until densified.

FIG. 12 illustrates method 1200 of hot pressing reactive powders. Fine particles (e.g., a half of a micron in size) of the desired composition are mixed in step 1202 with binders and sintering aids and then pressed in a mold in step 1204 at a high enough temperature to cause consolidation and binding of the individual particles into a solid structure (e.g., 1000° C. to 4000° C., preferably 2000° C.) with low porosity (e.g., having grain size of less than half a micron in size). The hot pressing atmosphere is chosen to control the valence of the dopant atoms. After cooling and removal from the hot press in step 1206, the pieces may be machined or otherwise sized to achieve the required tolerances in step 1208. The pieces may then be treated in optional step 1210 to produce the desired surface layer (e.g., 100 to 1000 Angstroms thick) by ion implantation, vapor deposition, chemical vapor deposition, physical deposition, electo-plating deposition, neutron bombardment or combinations of the above. In optional step 1212 the pieces may subsequently be heat treated (e.g., 2000° C. to 2500° C. for 3 to 5 minutes) in a controlled atmosphere to produce the desired layer properties through diffusion, recrystallization, dopant activation, and/or valence changes of metallic ions.

FIG. 13 illustrates method 1300 of fusion casting. Metals of the desired composition are melted in step 1302 in a non-reactive crucible then cast into an ingot. The ingot is then rolled in step 1304, extruded in step 1306, drawn in step 1308, pressed in step 1310, heat treated (e.g., at 1000° C. or 500° C. to 2500° C. for one to two hours) in step 1312 in a suitable atmosphere, and chemically treated in step 1314. The rolling 1304, extruding 1306, drawing 1308 and pressing 1310 steps shape the tip and the heat treatment 1312 and chemical treatment 1314 steps are for affecting or imparting the mechanical and electrical properties such as the hardness and resistivity. The pieces are then optionally machined or otherwise sized to achieve the required tolerances in step 1316. The metallic pieces are then optionally heat treated to produce the desired surface layer by vapor deposition, chemical vapor deposition, physical deposition, electoplating deposition, or combinations of the above in step 1318. The pieces may be subsequently heat treated (e.g., at 4000° C. for three to four hours) in a controlled atmosphere to produce the desired layer properties through diffusion, recrystallization, dopant activation, or valence changes of metallic ions in step 1320.

Although steps 1008, 1112, 1208, and 1316; 1010, 1114, 1210, and 1318; and 1012, 1116, 1212 and 1320 share similar descriptions they are given different labels because the details of how to best carry out these steps may be partly dependent upon the details of the preceding steps.

In the three methods above the heat-treating, hot pressing, and controlled atmospheres are preferably primarily an inert gas such as nitrogen using a nitrogen-based furnace.

The green body for the bonding tool tip can be formed by using a variety of other methods of casting high temperature ceramics such as injecting molding, cold isostatic, extrusion, slip casting, Hot Isostatic Pressing (HIP), and gelcasting Injection molding can be used with all types of ceramics. The features basic to injection molding are that the powder is placed in a thermosetting polymeric binder, is injected into a mold where it hardens with time, and then is ejected from the mold. A concern with injection molding is that the de-waxing or removing the resin should be done without degrading the surface of the green body.

When using slip casting, a slip may be made of water and the ceramic powder. The slip is cast into an absorbent mold. The casting rate is dependant on the pressure applied to the slip cast and the cast thickness. The geometry of the casting surface may also affect the casting time.

In extrusion, a feedrod for coextrusion is formed from the compounded material, which may have of a silicon nitride-filled core with a cladding of boron nitride-filled material. The feedrod is then extruded through a heated die to form fine filaments.

In dipcoating a single component filament (such as a silicon nitride-filled polymer) is pulled through a slurry of boron nitride which dries to form the cell boundary material.

Gelcasting is a ceramic-forming process for making high-quality, complex-shaped ceramic parts. Gelcasting can be used for making bonding tool tips 12 with any of the ceramic powders mentioned in this specification. Gelcasting involves mixing ceramic powders in a polymerizable aqueous monomer solution that is then gelled in a mold. The cast body will be both homogeneous in its chemistry and have a certain density, resulting in the material properties (e.g., hardness and resistivity) being constant throughout the body and the drying and sintering processes having uniform volume changes. Using Gelcasting, the casting time from design to final fired part can be one week.

Layers 71, 81, and 91 of bonding tool tip 12 may be made from several compositions of matter. A formula for dissipated ceramic may include alumina and zirconia and/or other elements. This mixture is both somewhat electrically conductive and mechanically durable. The tip of a bonding tool is coated with this material or can be made completely out of this material. The tip may be wedge-shaped or circular-shaped as shown and described in the earlier FIGS. 1 to 5, for example.

One actual sample was constructed with the following elements: Iron, Oxygen, Sodium, Carbon, Zirconium, Silicon, Aluminum, Yttrium.

While the range of alumina could extend from 15% to 85% and the range of zirconia from 15% to 85%, in one embodiment the sample included alumina at 40% and zirconia at 60%.

Figure 14:
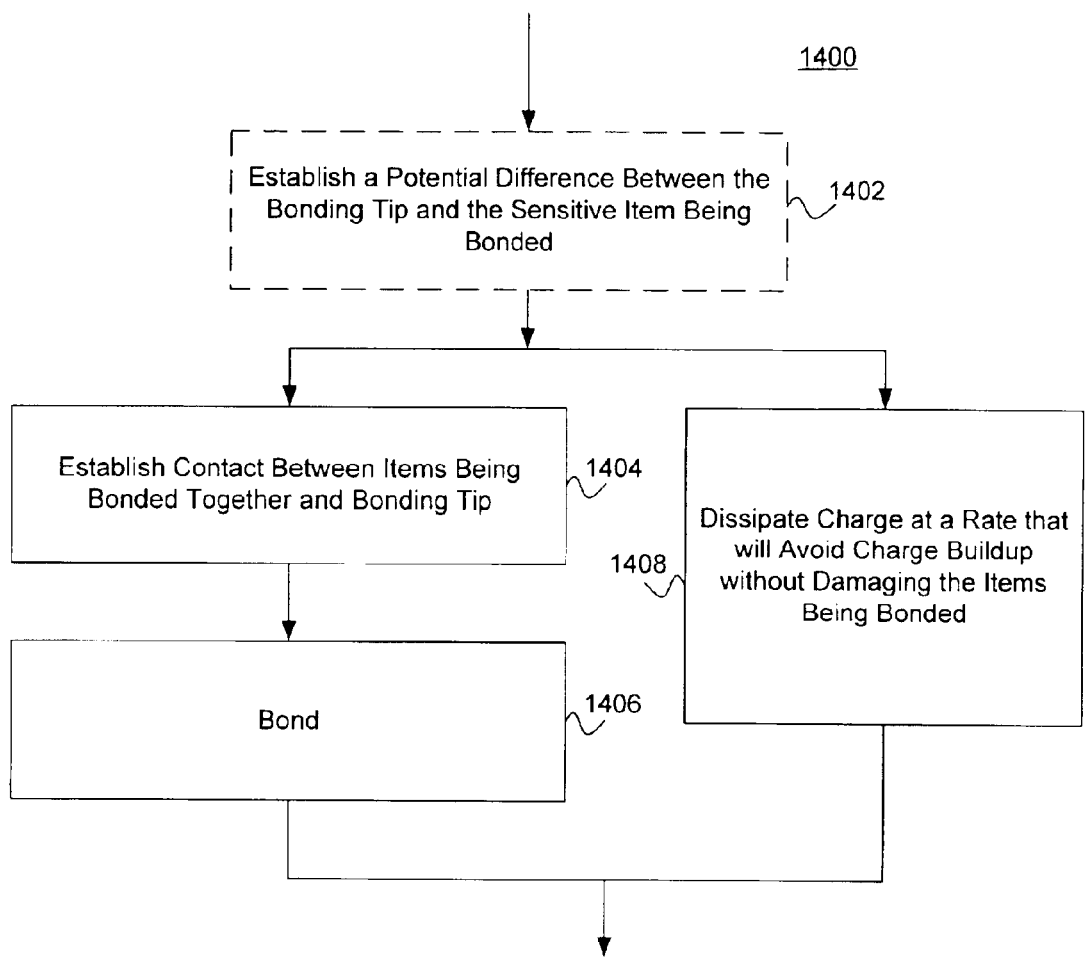
FIG. 14 is a flowchart for a method of using the bonding tool tip according to the invention.

FIG. 14 is a flowchart for a method of using the invention. In optional step 1402 an initial potential is established between the bonding tool tip and the item being bonded that is sensitive to electrical discharge. Although not necessary, establishing a potential may give the user some additional control over how the tip discharges. Establishing a potential may involve establishing an electrical connection or grounding the lead frame, individual leads on the integrated circuit and/or the individual bond pads on the integrated circuit. In step 1404 the bonding tool tip is placed in contact with the items being bonded together to hold them in place. In step 1406 the bond is formed. Steps 1404 and 1406 may be performed simultaneously as part of the same step. In step 1408 the charge is dissipated. This step may be performed simultaneously with steps 1404 and 1406. It is important that this step be performed whenever the tip and the electrostatic discharge sensitive component are in contact to prevent a discharge.

For example, in the case of a capillary tip the wire is fed through the tubular bonding tool tip prior to placing it in contact with the items being bonded. Then an electrical discharge at the bonding tool tip is supplied by a separate EFO device to melt a bit of the wire, forming a bonding ball. The ball then makes intimate contact with the film formed on the die pad on the integrated circuit, initiating the dissipation of charge. The bonding tool tip is then moved from the integrated circuit die pad, with gold wire being fed out as the tool is moved, onto the bond pad on the lead frame, and then scrubbed laterally by an ultrasonic transducer. Pressure from the bonding tool tip and the transducer, and capillary action, 'flows' the wire onto the bonding pad where molecular bonds produce a reliable electrical and mechanical connection while still dissipating charge. In this example the bonding, the contact between the bonding tool tip and the electrostatic discharge sensitive integrated circuit, and the dissipation all occur essentially simultaneously.

Figure 15:
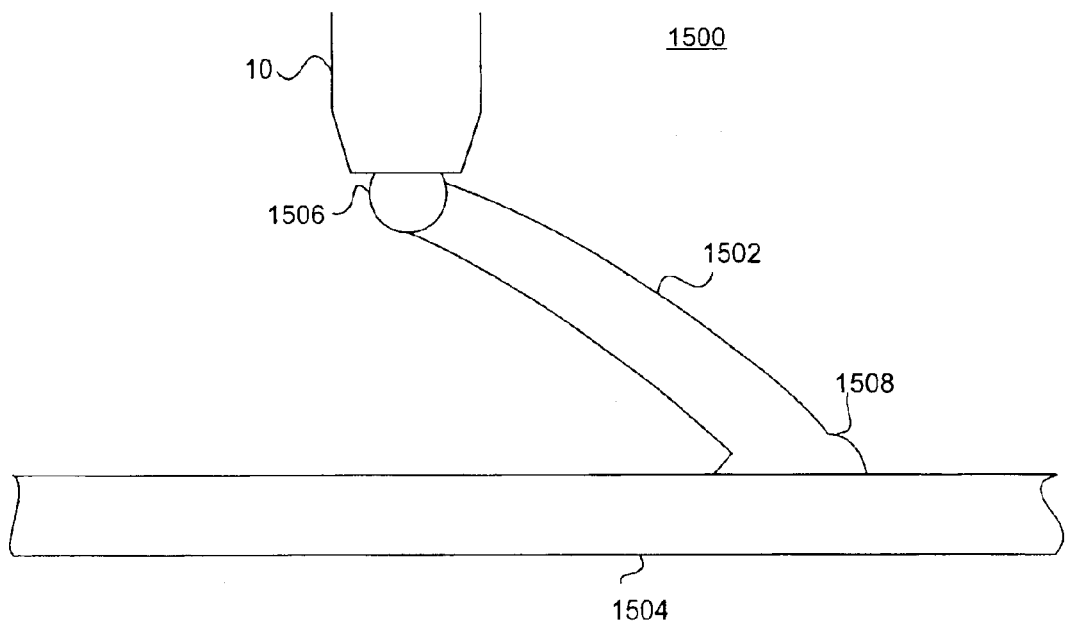
FIG. 15 is an illustration showing the method of use of a capillary bonding tool tip according to the invention.

FIG. 15 shows a capillary bonding tool 10 being used to bond wire 1502 to pad 1504. Ball 1506 will be used to bond wire 1502 to the next point. The bonding joint 1508 was formed with a ball similar to 1506. The difference between this method of use and the prior art is primarily in the dissipation of charge from the bonding tool 10.

The bonding tool tip 12 of the present invention could be used for any number of different types of bonding. Two examples are ultrasonic and thermal bonding.

Figure 16:
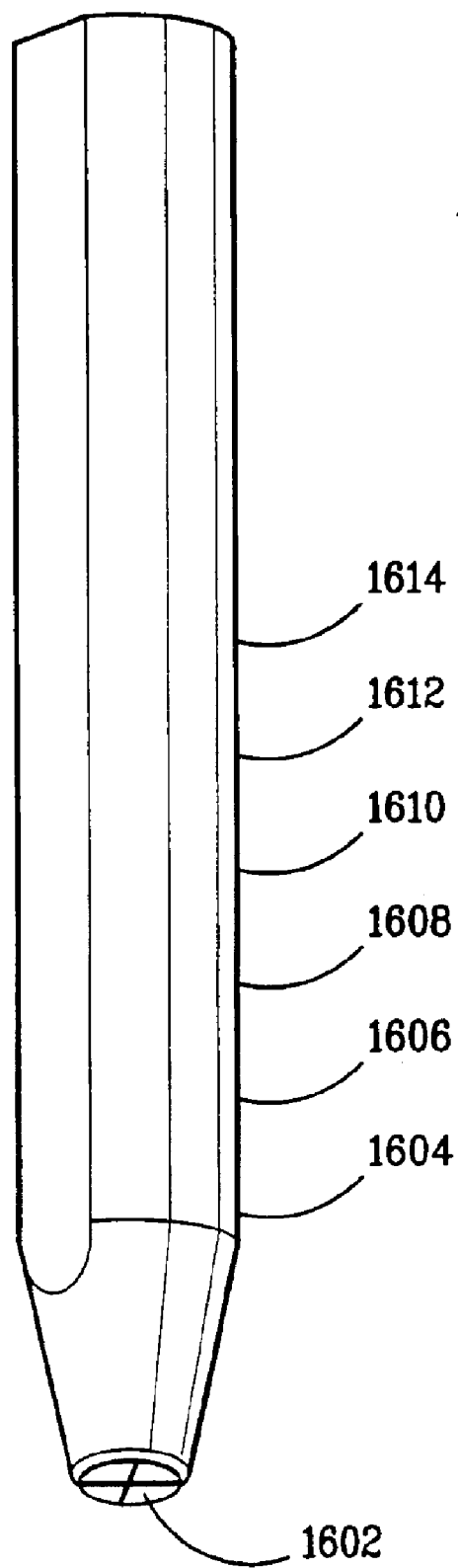
FIG. 16 shows sections of the bonding tool whose resistances were measured.

FIG. 16 shows sections of the bonding tool 10 having end 1602 and points 1604–1614. Point 1604 is 1 inch from end 1602 whose resistances were measured. Points 1604–1614 are each one inch apart.

Two ceramic rods #1 and #2 (not shown), were used as the base material for ceramic wire bonding tool tips 12 to form bonding tools 10 according to the invention. The two rods each had a diameter of approximately 0.07 inches. The point-to-point resistances along both of the rods were measured from the end of the bonding tool tip to various points along the tool tip at 10 and 100 volts. The resistance at each voltage was measured six times, each time from end 1602 to a different one of points 1604–1614 to obtain measurements of a 1, 2, 3, 4, 5, and 6 inch section, respectively, that starts at end 1602.

FIG. 17 is a table of resistances for two ceramic bonding tools measured at the points shown in FIG. 16. As shown in the table and as discussed in the preceding paragraph, the resistances were measured at 1, 2, 3, 4, 5, and 6 inches at 10V and 100V. The two bonding tools had point-to-point resistances that varied between $1.8 \times 10^8$ Ω and $1.9 \times 10^9$ Ω. After measuring the resistances according to FIG. 16 the static discharge was measured.

FIG. 18 is a schematic representation of the experimental setup used for measuring the static discharge having bonding tool 10, clamp 1802, voltmeter 1804, current probe 1806, oscilloscope 1808, and ElectroStatic Discharge (ESD) simulator 1810.

The static discharge was measured by charging bonding tool 10 and measuring the time required for the charge to dissipate. The charge was assumed to have dissipated once the current from the bonding tool 10 to ground dropped off significantly from its initial value (e.g., the current was less than 10% of its initial value). The current was measured from the bonding tool 10 when it was charged and grounded. The bonding tool 10 was held in insulative clamp 1802 on a ring stand (not shown), charged to a known voltage with ESD simulator 1810. The voltage was verified using voltmeter 1804, and then the bonding tool 10 was grounded. The current moving through the ground wire was measured with current probe 1806 connected to oscilloscope 1808. Ten measurements were made at each voltage level on the bonding tool 10. Using the setup of FIG. 18 the bonding tool 10 can be charged and discharged successively. The rise and fall of the current is plotted by the trace on oscilloscope 1808 which allows the discharge time of several successive cycles of discharging to be viewed and measured graphically.

The voltmeter 1804 could be, but is not limited to, a TREK model 341 non-contact voltmeter. The current probe 1806 could be, but is not limited to, a CT-1 current probe. Oscilloscope 1808 could be, but is not limited to, a Tektronics TDS 520A Digital Oscilloscope. The ESD simulator 1810 could be, but is not limited to, a KeyTech MZ-15.

FIG. 19 is a table showing the static decay times measured using the experimental setup of FIG. 18. The static decay from 1000 volts to 10 volts was also measured on both rods, #1 and #2. The static decay times varied between 0.1 and 0.5 seconds, or more precisely between 0.12 and 0.48 seconds, indicating how quickly the charge dissipate. The decay time is the product of the resistance times the capacitance. Using the data of the tables of FIGS. 17 and 19 an estimate of the capacitance as a function of position associated with the bonding tool 10 can be made, indicating how much charge may build up in bonding tool 10.

Figure 20:
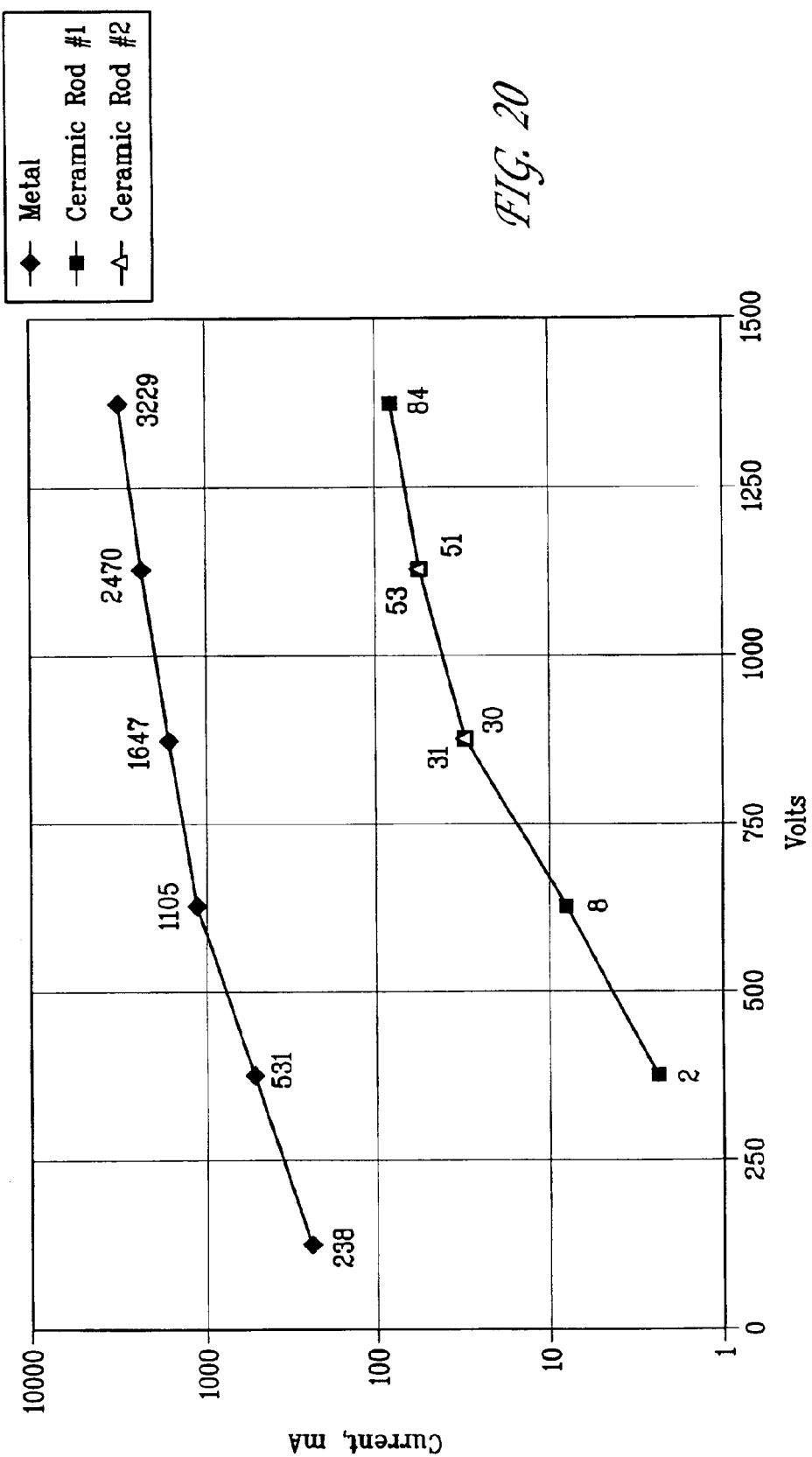
FIG. 20 is a plot comparing the discharge current at various voltages of the ceramic bonding tools to a metal rod.

FIG. 20 is a plot comparing the discharge current at various voltages of the ceramic bonding tools to a metal rod. The averages of the current at each voltage level are plotted in FIG. 20. One of the bonding tools (#1) was measured at five different voltages, and the other bonding tool (#2) was measured at two voltage levels to verify the discharge currents. The data points representing the two bonding tool tips are marked using squares for one tool tip and triangles for the other. The data points representing the metal rod are marked with diamonds. The resistance associated with this measurement is around $1 \times 10^5$ Ω or more precisely between about $7.5 \times 10^4$ Ω and $2.8 \times 10^5$ Ω. The current represents the discharge rate. Clearly the bonding tools discharge at a slower rate than the metal rod.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

What is claimed is:

1. A device comprising:
   a tip of a bonding tool having a dissipative material for use in wire bonding machines for connecting leads to integrated circuit bonding pads, wherein the tip has a static discharge time between 0.1 and 0.5 seconds.

2. A device comprising:
   a bonding tool tip having an electrically dissipative ceramic for use in capillary wedge-type wire bonding machines for connecting leads to integrated circuit bonding pads.

3. A method of using a bonding tool tip, comprising:
   providing an electrically dissipative bonding tool tip;
   bonding a material to a device;
   allowing an essentially smooth current to dissipate to the device, the current being low enough so as not to damage said device being bonded and high enough to avoid a build up of charge that could discharge to the device being bonded and damage the device being bonded.

* * * * *